(12) United States Patent
Curatola et al.

(10) Patent No.: US 8,569,799 B2
(45) Date of Patent: Oct. 29, 2013

(54) III-V SEMICONDUCTOR DEVICES WITH BURIED CONTACTS

(75) Inventors: Gilberto Curatola, Villach (AT); Guanmauro Pozzovivo, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 41 days.

(21) Appl. No.: 13/331,899

(22) Filed: Dec. 20, 2011

(65) Prior Publication Data
US 2013/0153919 A1    Jun. 20, 2013

(51) Int. Cl.
*H01L 29/66*    (2006.01)

(52) U.S. Cl.
USPC ............................................. 257/194; 257/76

(58) Field of Classification Search
USPC .................. 257/183, 194, E29.338, E21.403, 257/E29.246, E29.089; 438/167, 172
See application file for complete search history.

(56) References Cited

U.S. PATENT DOCUMENTS 7,238,560 B2 *   7/2007   Sheppard et al. ............. 438/172
2010/0038682 A1 *  2/2010   Lahreche ...................... 257/194

FOREIGN PATENT DOCUMENTS

JP          2009099601 A  *  5/2009

* cited by examiner

*Primary Examiner* — N Drew Richards
*Assistant Examiner* — Christina Sylvia
(74) *Attorney, Agent, or Firm* — Murphy, Bilak & Homiller, PLLC

(57) ABSTRACT

A semiconductor device such as a diode or transistor includes a semiconductor substrate, a first region of III-V semiconductor material on the semiconductor substrate and a second region of III-V semiconductor material on the first region. The second region is spaced apart from the semiconductor substrate by the first region. The second region is of a different composition than the first region. The semiconductor device further includes a buried contact extending from the semiconductor substrate to the second region through the first region. The buried contact electrically connects the second region to the semiconductor substrate.

24 Claims, 20 Drawing Sheets

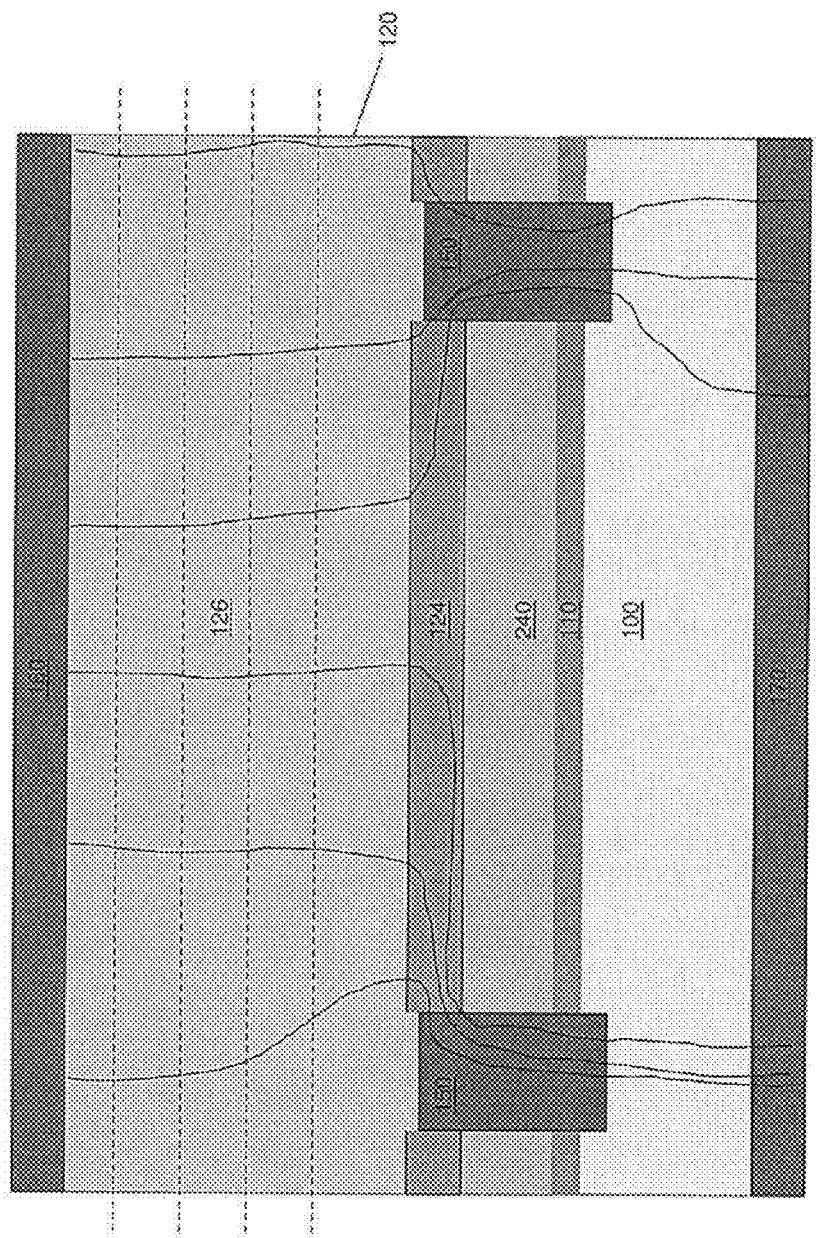

III-V SEMICONDUCTOR DEVICES WITH BURIED CONTACTS

FIELD OF TECHNOLOGY

The present application relates to III-V semiconductor devices, in particular buried contacts for III-V semiconductor devices.

BACKGROUND

Conventional GaN high voltage Schottky diodes can be classified into two main categories: lateral devices and vertical devices. Lateral GaN Schottky diodes make use of a 2DEG (two dimensional electron gas) inherently provided by a conventional AlGaN/GaN system and require a minimum lateral distance between the anode and cathode contacts to sustain a high voltage. Vertical GaN Schottky diodes typically make use of a GaN buffer and do not require the presence of a lateral 2DEG channel. Instead, the anode is formed on the top a lightly doped GaN buffer and the cathode is represented by a lower contact disposed at the bottom of the GaN buffer. In order to have a good bottom contact, a highly doped layer is needed between the bottom contact and the GaN buffer.

The presence of a high mobility 2DEG in lateral diode devices achieves high current compared to their vertical counterparts. However vertical diode devices have better area efficiency due to the current flow direction and therefore have considerably reduced device dimensions as compared to lateral devices. Moreover, a Schottky contact directly placed on top of a GaN buffer results in a lower forward bias when compared with an AlGaN/GaN system. It therefore would be desirable to have a GaN device possessing the high current advantage of conventional lateral GaN devices and the area efficiency and low forward bias of conventional vertical GaN devices.

SUMMARY

Disclosed herein are III-V semiconductor devices such as diodes and transistors having high current, area efficiency and low forward bias, and methods of manufacturing such devices. The devices can be integrated into existing GaN-on-silicon platforms. The devices are 'quasi' vertical so that their dimensions can be considerably scaled with respect to conventional lateral III-V semiconductor devices. The devices can have an intrinsic two dimensional electron gas (2DEG), providing high current capability. The high current capability can be further increased by providing two parallel current paths instead of just one. For a diode, the forward bias can be tailored with minor process modifications.

According to an embodiment of a semiconductor device such as a diode or transistor, the device includes a semiconductor substrate, a first region of III-V semiconductor material on the semiconductor substrate and a second region of III-V semiconductor material on the first region. The second region is spaced apart from the semiconductor substrate by the first region. The second region is of a different composition than the first region. The semiconductor device further includes a buried contact extending from the semiconductor substrate to the second region through the first region. The buried contact electrically connects the second region to the semiconductor substrate.

According to an embodiment of a method of manufacturing a semiconductor device such as a diode or transistor, the method includes: forming a first region of III-V semiconductor material on a semiconductor substrate; forming a second region of III-V semiconductor material on the first region so that the second region is spaced apart from the semiconductor substrate by the first region, the second region being of a different composition than the first region; and forming a buried contact extending from the semiconductor substrate to the second region through the first region, the buried contact electrically connecting the second region to the semiconductor substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5 illustrates a cross-sectional view of still another embodiment of a III-V semiconductor diode having a buried contact.

DETAILED DESCRIPTION

Embodiments described herein relate to a 'quasi' vertical semiconductor device and methods of manufacturing such a device. The device is 'quasi' vertical in that the current path of the device has a lateral component and a vertical component. The lateral component of the current path can be provided by a 2DEG formed in an upper part of a III-V semiconductor buffer region such as a GaN buffer region when a III-V semiconductor barrier region e.g. made of AlGaN is formed on the buffer region. The lateral component of the current path instead can be provided by highly doping the lower part of the buffer region, or a combination of both approaches. The vertical component of the current path is provided by the buffer region. In each case, the semiconductor device includes one or more buried contacts extending from the buffer region to an underlying semiconductor substrate through an additional III-V semiconductor material separating the buffer region from the substrate. Each buried contact provided electrically connects the buffer region to the substrate to complete the current flow path through the stack of III-V semiconductor materials. The semiconductor device can be a diode, transistor, etc. Described next are embodiments of a 'quasi' vertical diode, followed by a description of the embodiments of a 'quasi' vertical transistor.

Figure 1:
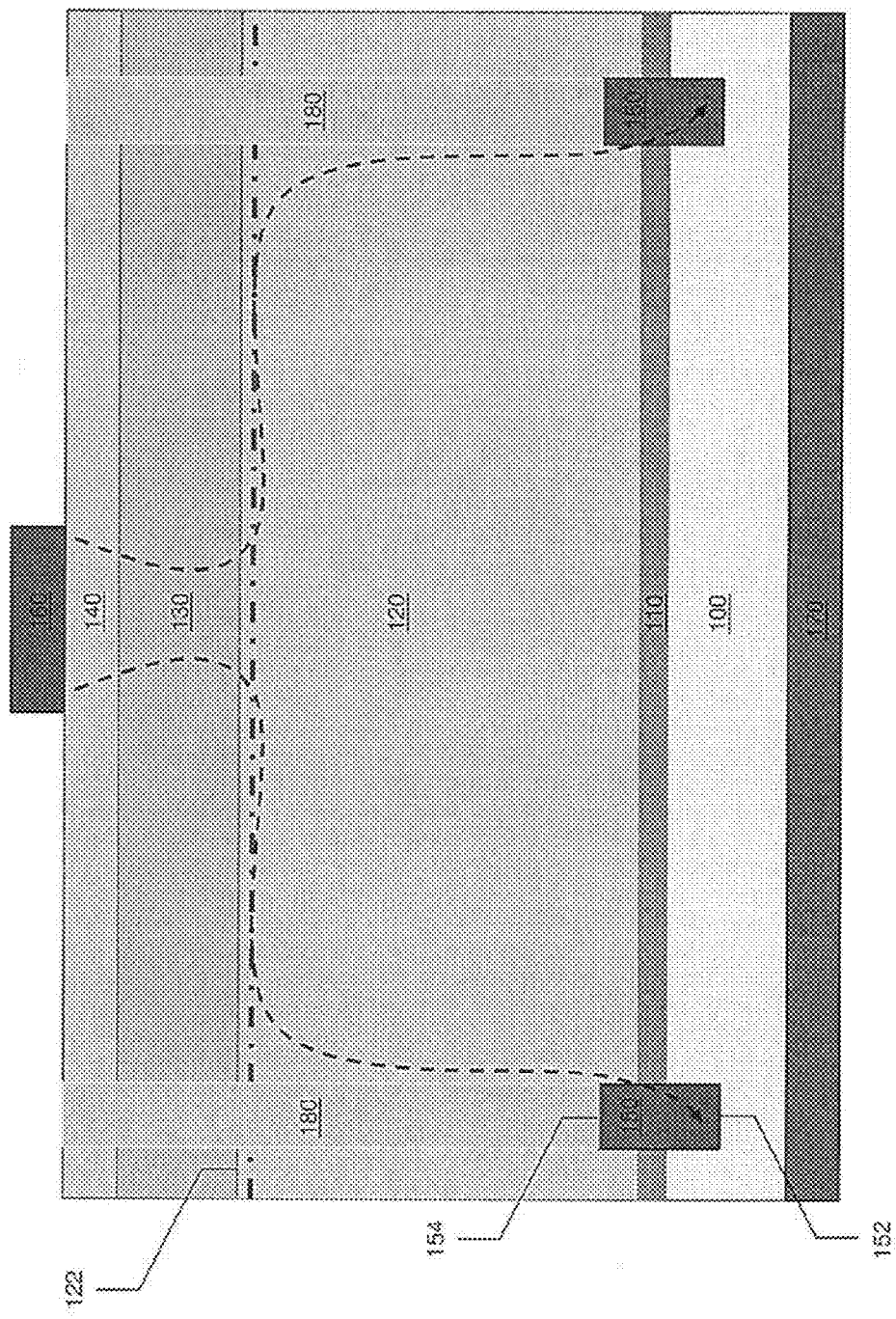
FIG. 1 illustrates a cross-sectional view of an embodiment of a III-V semiconductor diode having a buried contact.

FIG. 1 illustrates an embodiment of a diode. The diode includes a semiconductor substrate 100, a first region of III-V semiconductor material 110 on the substrate 100, and a second region of III-V semiconductor material 120 on the first region 110. The second region 120 is spaced apart from the substrate 100 by the first region 110, and the second region 120 is of a different composition than the first region 110. In one embodiment, the first region 110 is a nucleation (seed) layer such as an AlN layer for providing thermal and lattice matching to the substrate 100. The second region 120 is a buffer region such as a GaN buffer region. In one embodiment, the buffer region 120 comprises AlxGa1-xN with 0<=x<1, where the Al content in the GaN acts as a back barrier for confining electrons to the channel. For example the AlxGa1-xN buffer region 120 can have a sequence of different AlGaN layers (compositional grading). The buffer region 120 can be made thick enough so that the diode withstands voltages in the range of 300V to 1200V.

The diode further includes a third region of III-V semiconductor material 130 on the second region 120. The third region 130 has a band gap greater than the band gap of the second region 120 and causes a 2-D electron gas (2DEG) in the second region 120. The 2DEG provides a conductive lateral channel for current flow. The 2DEG is illustrated with a horizontal dashed and dotted line in FIG. 1. The third region 130 is a barrier region such as an AlGaN barrier region. A fourth region of III-V semiconductor material 140 such as a GaN cap region is formed on the barrier region 130 so that the barrier region 130 is interposed between the buffer region 120 and the cap region 140. The current flow path of the diode also has a vertical path through the cap, barrier and buffer regions 140, 130, 120 to one or more buried contact(s) 150 as indicated by the dashed lines in FIG. 1.

Each buried contact 150 extends from the substrate 100 to the buffer region 120 through the nucleation region 110. The buried contact(s) 150 electrically connect the buffer region 120 to the substrate 100. In one embodiment, the substrate 100 is a silicon substrate. In another embodiment, the substrate 100 is a SiC substrate. Still other types of semiconductor substrates may be used.

The diode also has a metallization layer 160 on top of the stack of semiconductor materials 110, 120, 130, 140 and a second metallization layer 170 at the bottom side of the substrate 100. The upper metallization layer 160 forms the anode terminal of the diode and the lower metallization layer 170 forms the cathode terminal. When forward biased, the diode conducts current along a first vertical path extending through the cap and barrier regions 140, 130, a lateral path along the 2DEG and a second vertical path from the 2DEG, through the buffer region 120 and to the buried contact(s) 150. According to the embodiment shown in FIG. 1, each buried contact 150 has a first side 152 contacting the semiconductor substrate 100 and a second opposing side 154 contacting the buffer region 120. A dielectric material 180 such as SiO2 extends from the second side 154 of the buried contact 150 toward a side 122 of the buffer region 120 facing away from the first region. In FIG. 1, the dielectric material 180 extends all the way to the cap region 140.

The diode is a high voltage diode as explained above and e.g. can withstand voltages in the range of 300V to 1200V. The voltage rating of the diode is a function at least in part of the thickness of the buffer region 120. The buffer region 120 can be made thick enough so that the diode can withstand high voltages.

Figure 2A:
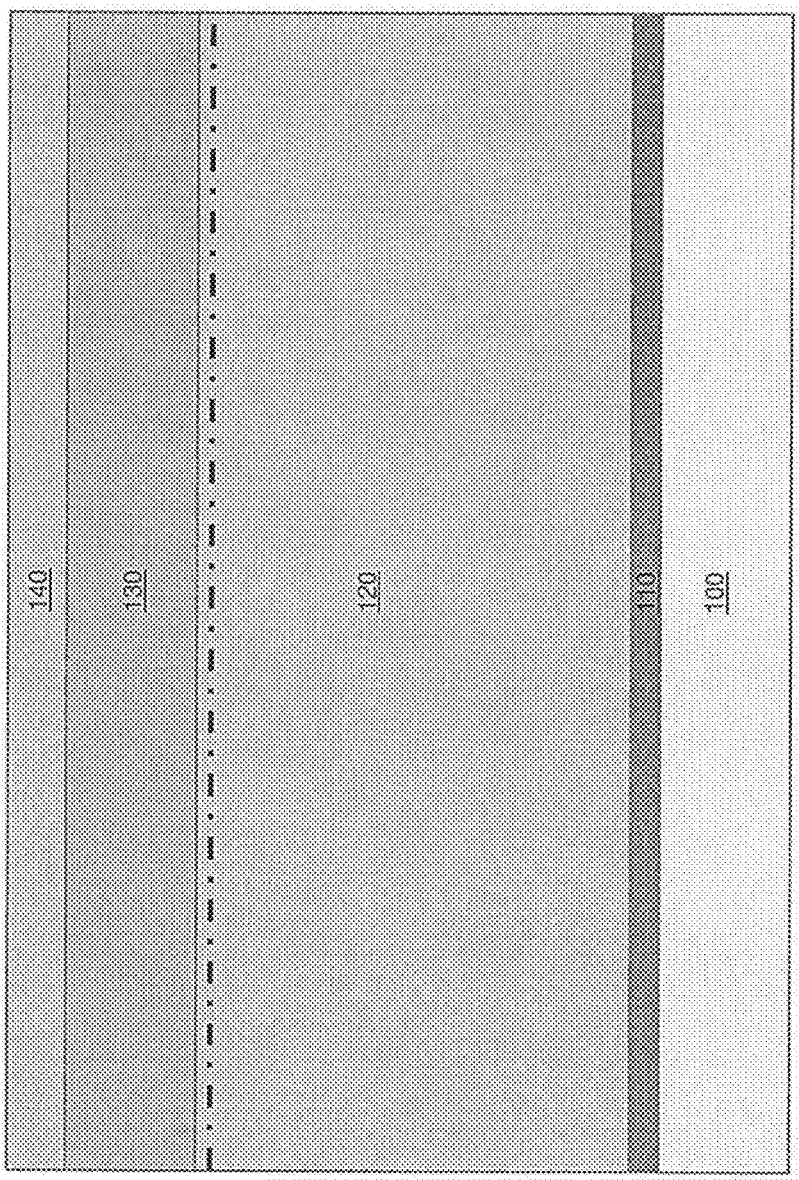
FIGS. 2A to 2D illustrate cross-sectional views of an embodiment of a method of manufacturing the diode shown in FIG. 1.

FIGS. 2A to 2D illustrate an embodiment of a method of manufacturing the diode shown in FIG. 1. FIG. 2A shows the structure after the nucleation region 110 is formed on the substrate 100, the buffer region 120 is formed on the nucleation region 110, the barrier region 130 is formed on the buffer region 120 and the cap region 140 is formed on the barrier region 130. These III-V semiconductor regions 110, 120, 130, 140 can be formed using any suitable conventional processing such as epitaxy.

Figure 2B:
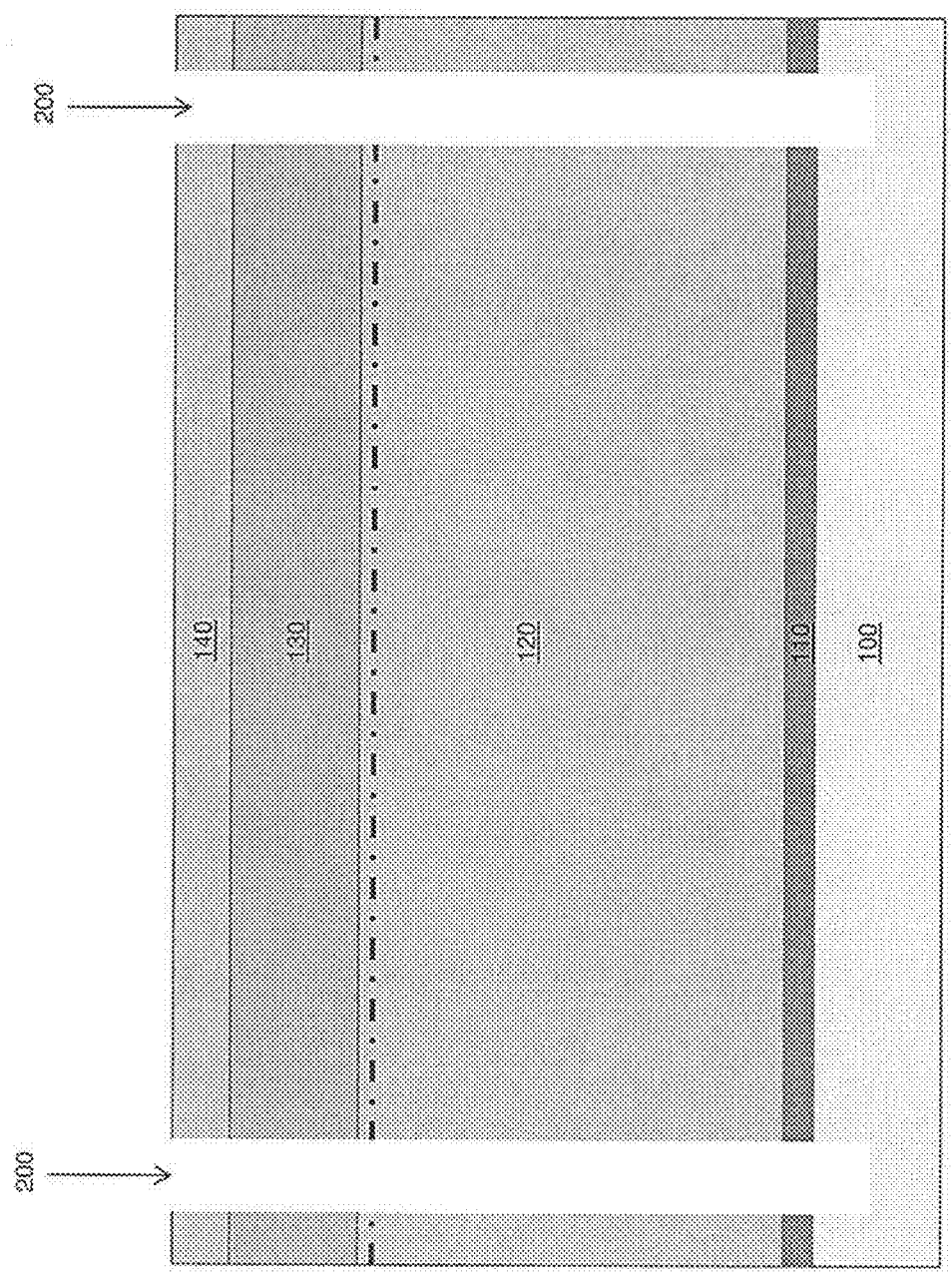
Figure 2C:
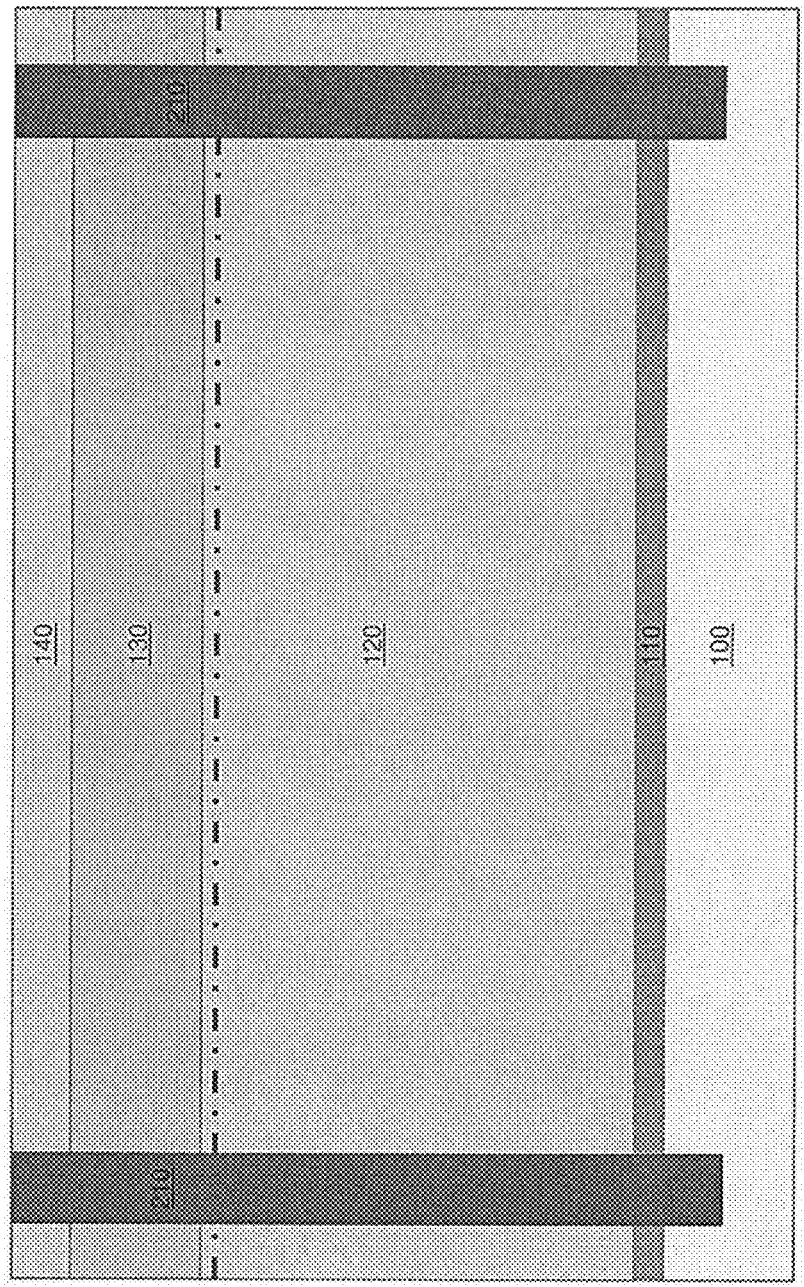

FIG. 2B shows the structure after one or more openings 200 are formed through the regions 110, 120, 130, 140 of III-V semiconductor material to the substrate 100. Any conventional etching process can be used to form the opening(s) 200. At this point in the method, a portion of the substrate 100 is exposed through each opening 200. FIG. 2C shows the structure after each opening 200 is filled with a conductive material 210. In one embodiment, the conductive material 210 is tungsten. In the case of tungsten and a silicon substrate, an additional barrier layer such as Ti/TiN is provided between the tungsten and the Si. In another embodiment, the conductive material 210 is doped polysilicon. Other conductive materials may be used instead or in addition to tungsten and/or doped polysilicon.

Figure 2D:
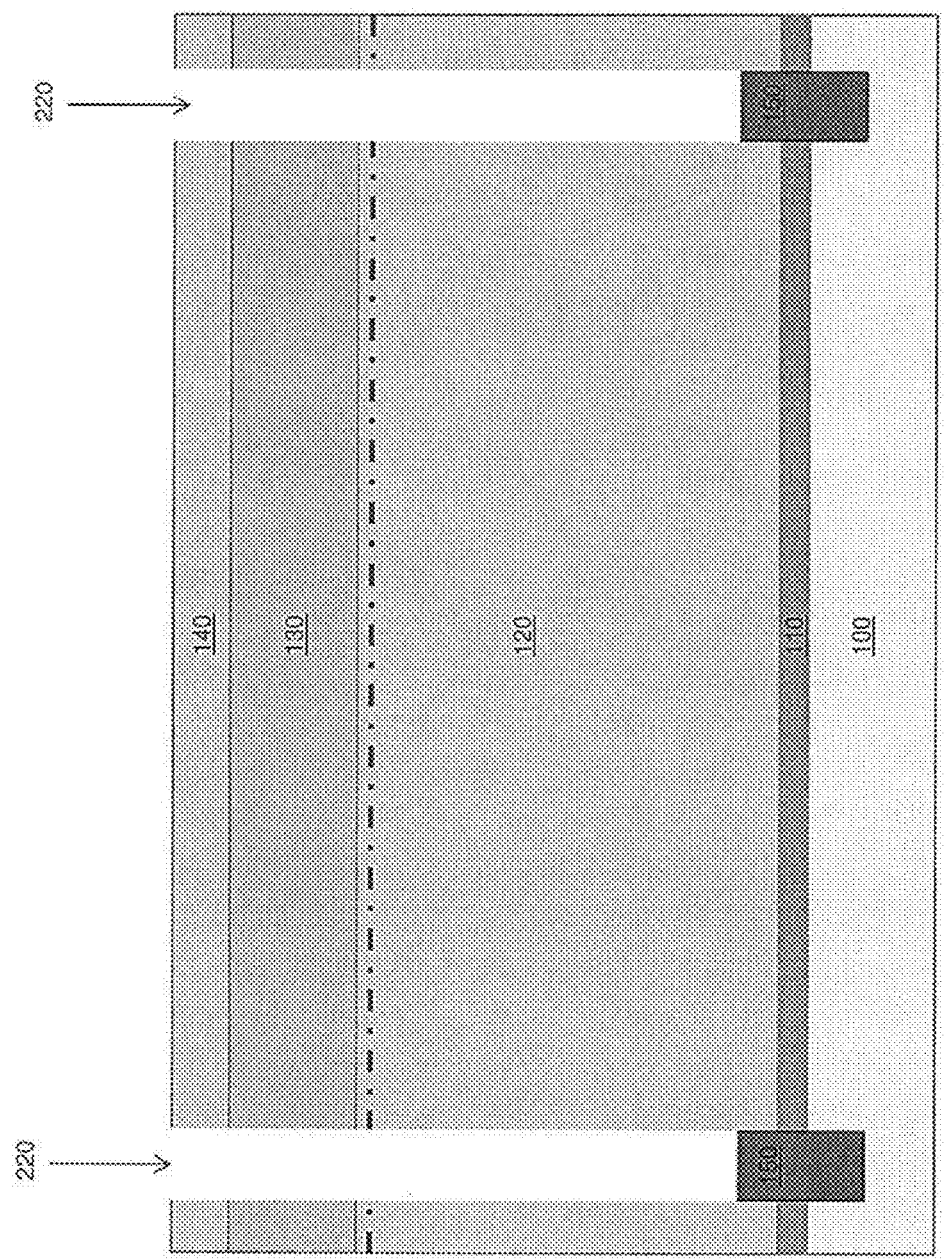

The conductive material 210 is then recessed to form the corresponding buried contact 150 as shown in FIG. 2D. Any suitable conventional process for removing the excess conductive material 210 can be used. A residual opening 220 remains in the buffer, barrier and cap regions 120, 130, 140 above the buried contact 150 after the conductive material removal process as shown in FIG. 2D. The residual opening(s) 220 can be filled with a dielectric material 180 such as SiO2 if desired, and the anode and cathode terminals 160, 170 of the diode are formed yielding the diode shown in FIG. 1.

During operation of the diode, current vertically flows from the cap region 140, through the barrier region 130, horizontally along the 2DEG and then vertically through the entire buffer region 120 in case a voltage is applied to the anode terminal 160. Since the current is forced to flow into the buffer region 120 before reaching the bottom cathode terminal 170, the diode is intrinsically a 'quasi' vertical device and has reduced lateral dimensions as compared to conventional lateral diodes. By providing more than one buried contact 150 for electrically connecting the buffer region 120 to the substrate 100, parallel paths for the current flow arise as indicated by the two dashed lines shown in FIG. 1 which greatly increases the current drive capability of the diode.

Figure 3:
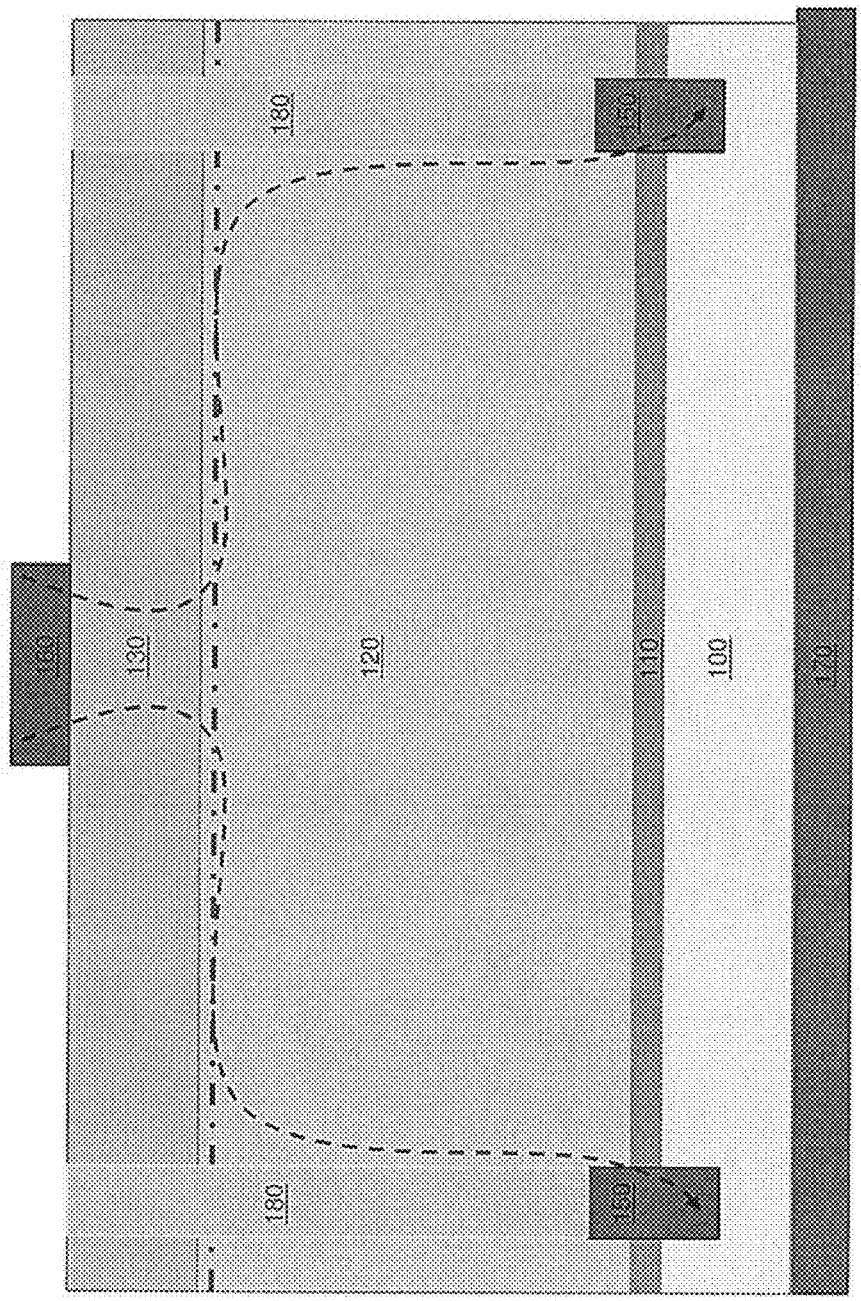
FIG. 3 illustrates a cross-sectional view of another embodiment of a III-V semiconductor diode having a buried contact.

FIG. 3 illustrates another embodiment of the diode. The diode of FIG. 3 is similar to the one shown in FIG. 1, except the top cap region 140 is omitted. The current flow path is shown in FIG. 3 with dashed lines.

Figure 4:
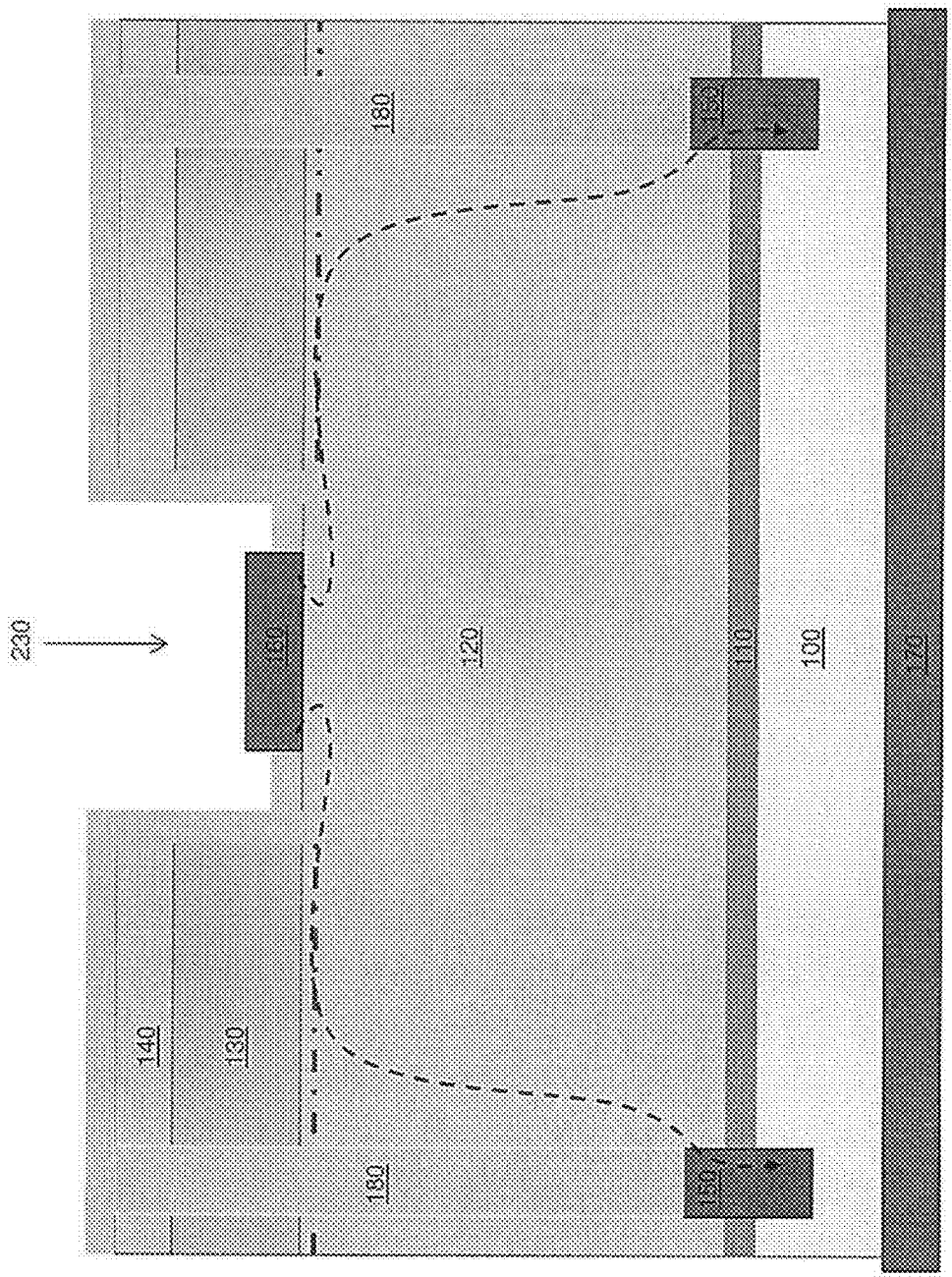
FIG. 4 illustrates a cross-sectional view of yet another embodiment of a III-V semiconductor diode having a buried contact.

FIG. 4 illustrates yet another embodiment of the diode. The diode of FIG. 4 is similar to the one shown in FIG. 1, except a recess 230 is formed through the cap and barrier regions 140, 130. The anode terminal 160 is disposed in the recess 230 and in contact with the buffer region 120. The 2DEG terminates under the anode terminal 160 according to this embodiment because the barrier region 130 has no polarization effect on the buffer region 120 in this area. The 2DEG is divided into two sections, one on each side of the anode terminal 160 under the barrier region 130. The current flow path is shown in FIG. 4 with dashed lines.

FIG. 5 illustrates yet another embodiment of the diode. According to this embodiment, the cap and barrier regions 140, 130 are excluded, further optimizing the forward voltage of the diode. The forward voltage of the diode can also be optimized by metal gate work function engineering.

The buffer region 120 of the diode shown in FIG. 5 also has a more highly doped section 124 closer to the substrate 100 and a less highly doped section 126 spaced further from the substrate 100. A sequence 240 of GaN and AlGaN may be disposed between the more highly doped section 124 of the buffer region 120 and the underlying nucleation layer 110 according to this embodiment. In another embodiment, this lower sequence 240 of GaN and AlGaN is excluded. In each case, the buried contact(s) 150 electrically connect the more highly doped section 124 of the buffer region 120 to the semiconductor substrate 100. The buried contacts 150 in this case are laterally spaced apart from one another by the more highly doped section 124 of the buffer region 120 and the lower sequence 240 of GaN and AlGaN if provided. The more highly doped section 124 of the buffer region 120 provides a horizontal path for current to flow from the less highly doped section 126 of the buffer region 120 to the substrate 110. In FIG. 5, equipotential lines are shown as horizontal dashed lines and the current path is represented by solid lines extending from the anode terminal 160 to the cathode terminal 170 through the buffer region 120, buried contacts 150 and substrate 100.

Figure 6A:
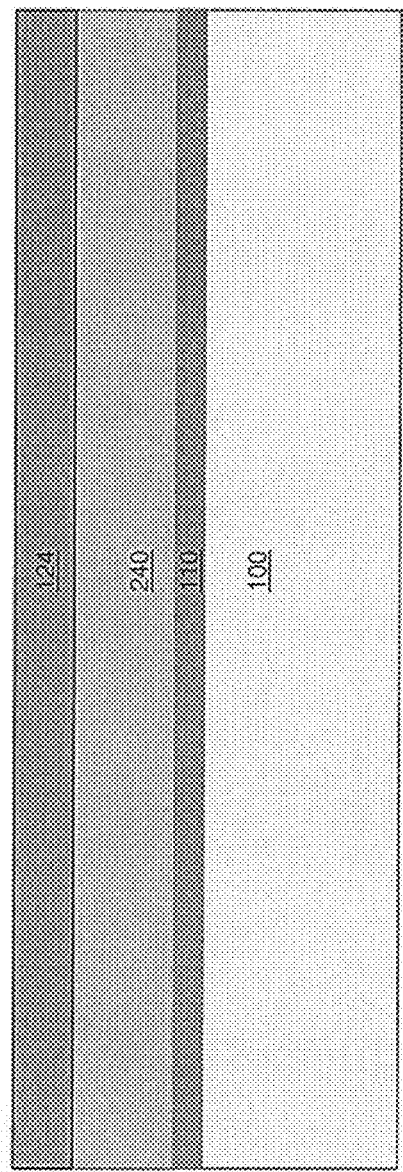
FIGS. 6A to 6E illustrate cross-sectional views of an embodiment of a method of manufacturing the diode shown in FIG. 5.

FIGS. 6A to 6E illustrate an embodiment of a method of manufacturing the diode shown in FIG. 5. FIG. 6A shows the structure after the nucleation region 110 (e.g. AlN) is formed on the substrate 100, the sequence 240 of GaN and AlGaN is formed on the nucleation region 110 and the more highly doped section 124 (e.g. n+ GaN) of the buffer region 120 is formed on the sequence 240 of GaN and AlGaN. These regions can be formed using any suitable conventional processing such as epitaxy.

Figure 6B:
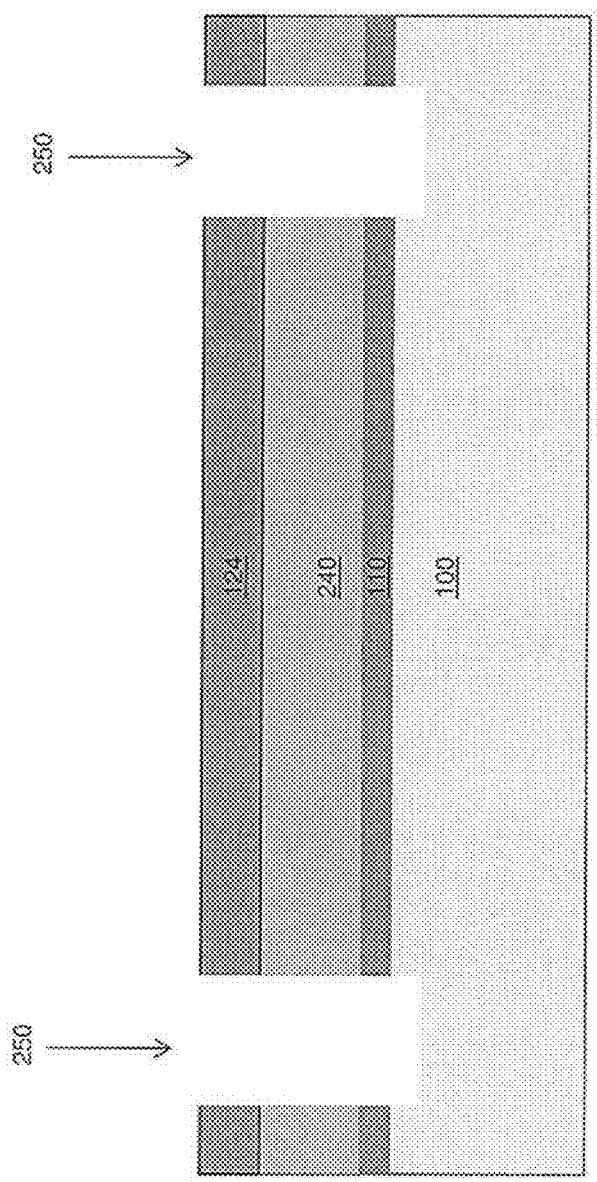
Figure 6C:
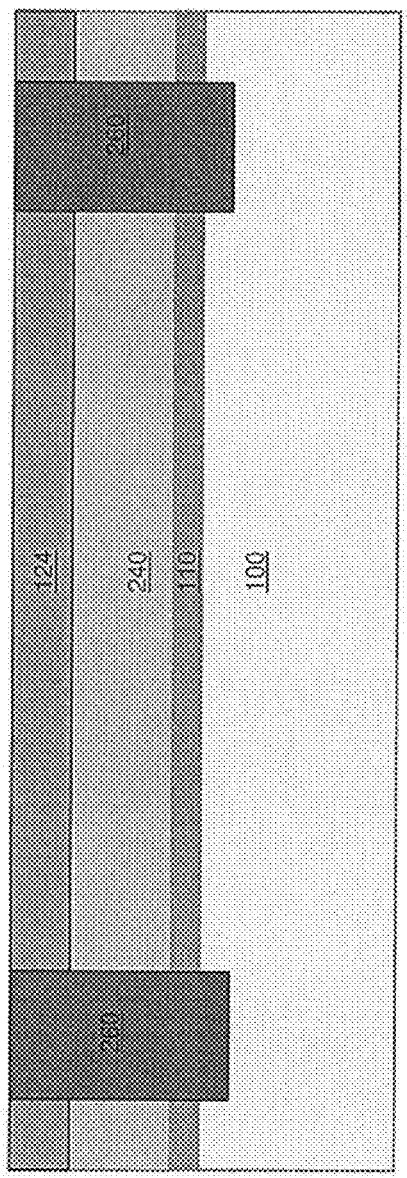

FIG. 6B shows the structure after one or more openings 250 are etched through the nucleation region 110, the sequence 240 of GaN and AlGaN and the more highly doped section 124 of the buffer region 120. Any conventional etching process can be used to form the openings 250. At this point in the method, a portion of the substrate 100 is exposed through each opening 250. FIG. 6C shows the structure after the openings 250 are filled with a conductive material 260. In one embodiment, the conductive material 260 is tungsten. In another embodiment, the conductive material 260 is doped polysilicon. Other conductive materials may be used instead or in addition to tungsten and/or doped polysilicon.

Figure 6D:
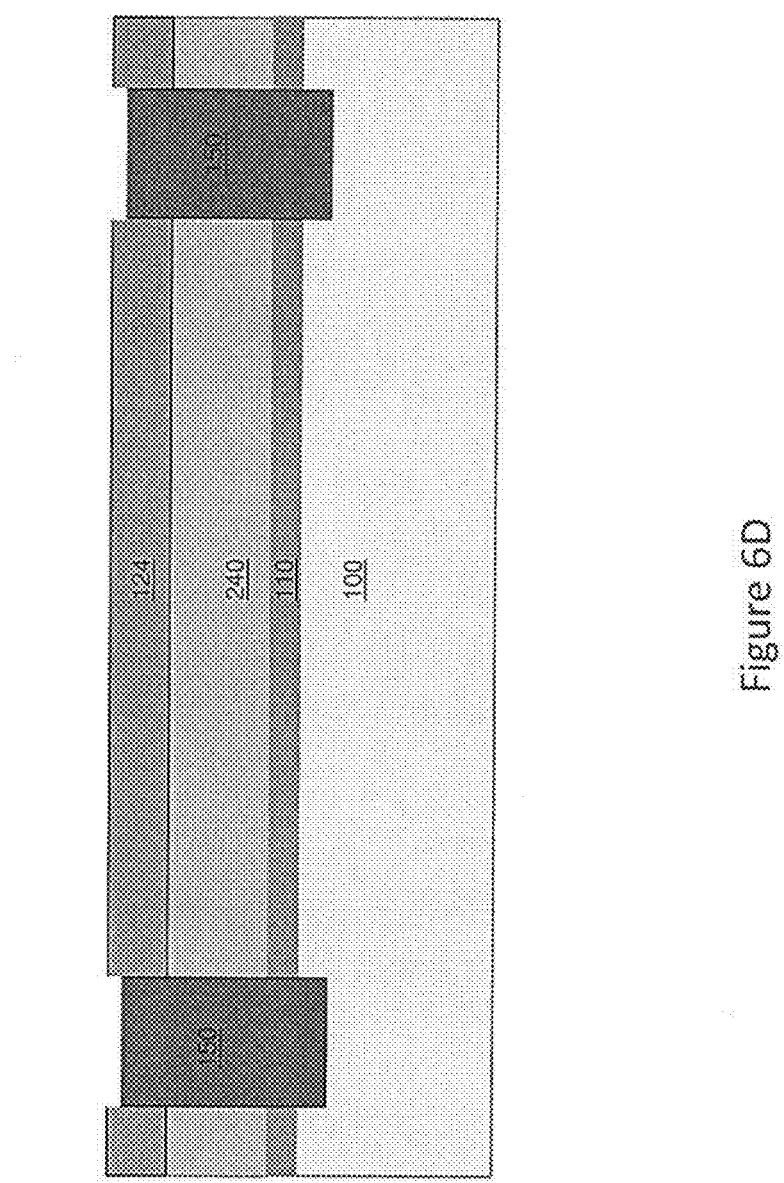
Figure 6E:
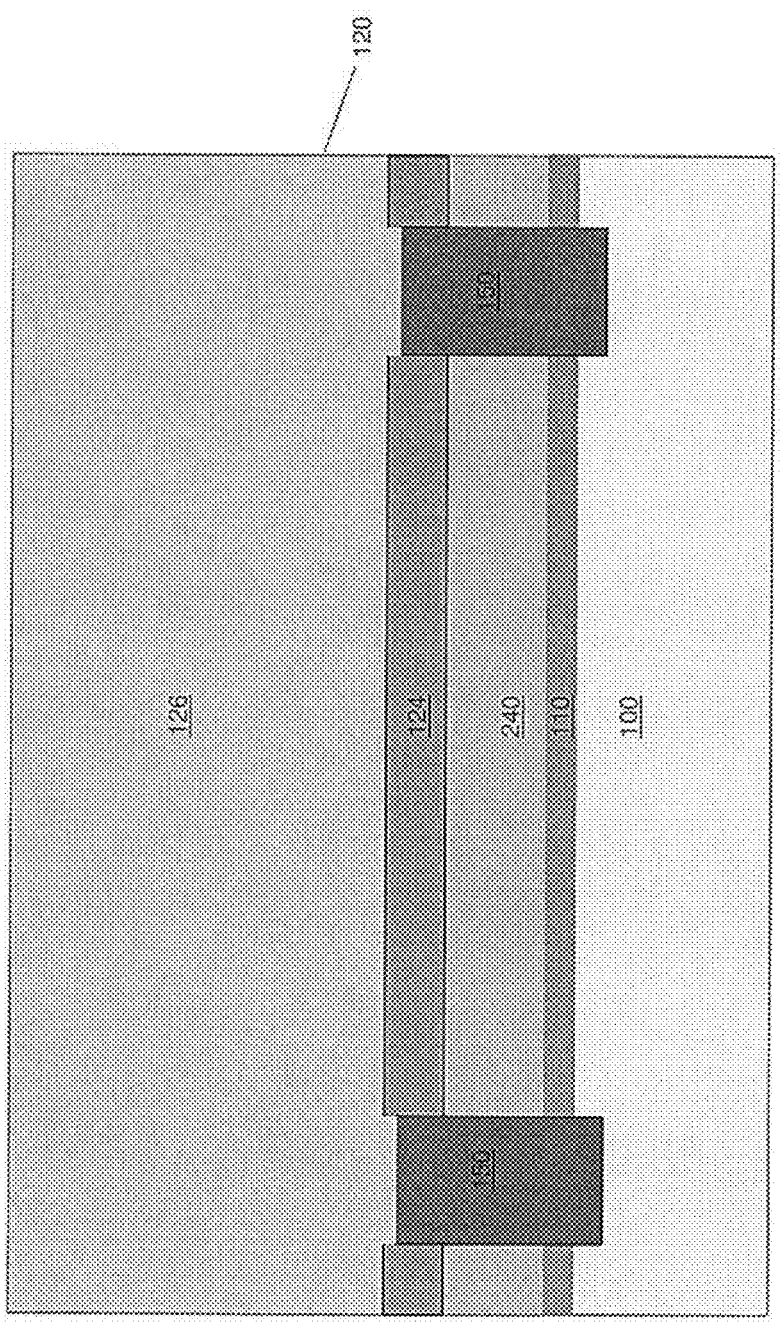

The conductive material 260 is then recessed to form the corresponding buried contact 150 as shown in FIG. 6D. The conductive material 250 is recessed slightly to facilitate the lateral overgrowth of the buffer region 120 over the buried contact(s) 150 as shown in FIG. 6E. Each buried contact 150 extends from the substrate 100 to the more highly doped section 124 of the buffer region 120 through the nucleation region 110 and the sequence 240 of GaN and AlGaN. The remainder of the buffer region 120 i.e. the less highly doped section 126 (e.g. n− GaN) can be formed by epitaxially growing the less highly doped section 126 on the more highly doped section 124 after the buried contact(s) 150 are formed after the recessing process. Doing so permits a lateral overgrowth of the less highly doped section 126 of the buffer region 120 over the buried contact(s) 150 as shown in FIG. 6D.

Figure 7:
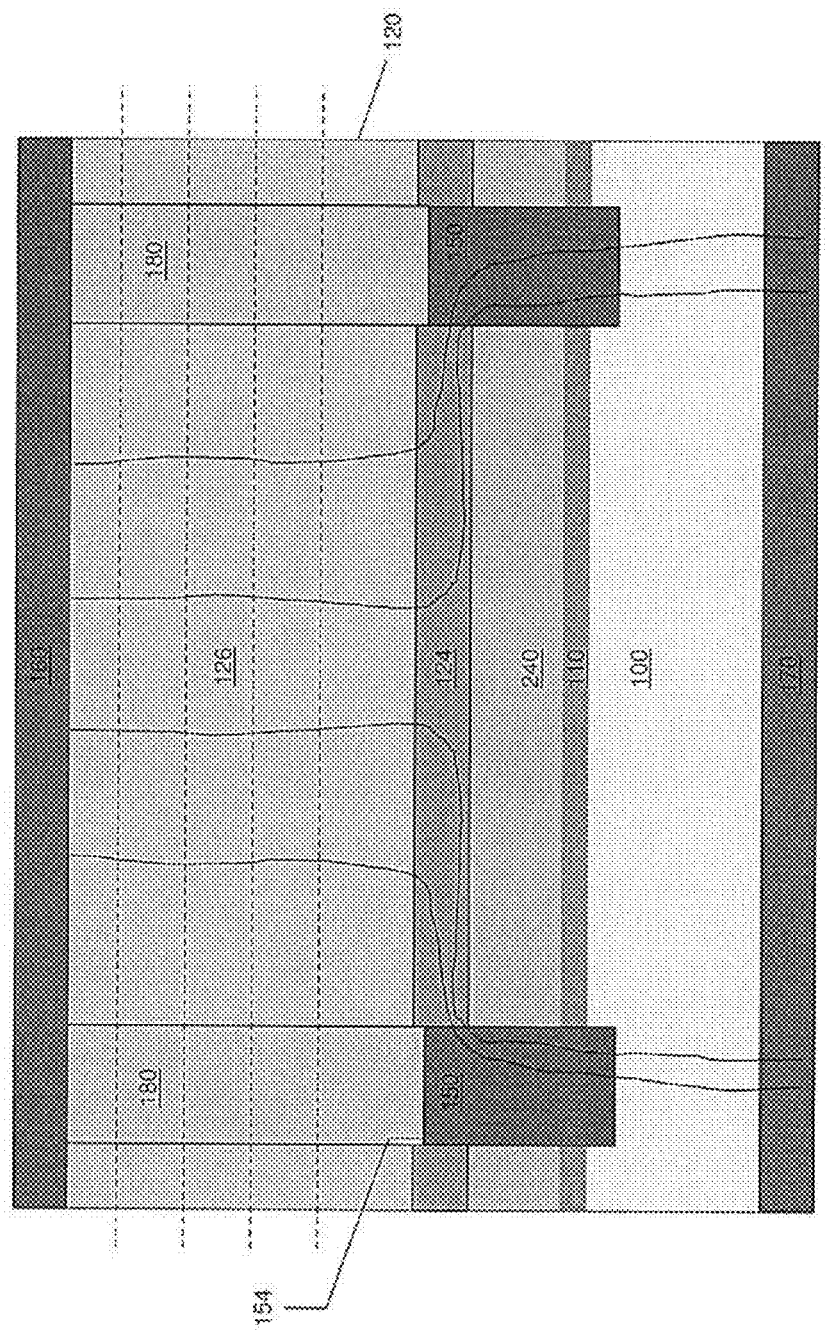
FIG. 7 illustrates a cross-sectional view of another embodiment of a III-V semiconductor diode having a buried contact.

FIG. 7 illustrates another embodiment of the diode without the cap and barrier regions 140, 130 excluded. In FIG. 7, equipotential lines are shown as horizontal dashed lines and the current path is represented by solid lines extending from the anode terminal 160 to the cathode terminal 170 through the buffer region 120, buried contact(s) 150 and substrate 100.

Current flows generally vertically through the less highly doped section 126 of the buffer region 120 and generally horizontally through the more highly doped section 124 of the buffer region 120. The structure of the diode shown in FIG. 7 is similar to the one shown in FIG. 5, however a dielectric material 180 extends from the side 154 of the buried contact(s) 150 facing away from the substrate 100 toward the top (anode) terminal 160. The dielectric material 180 provides isolation.

Figure 8A:
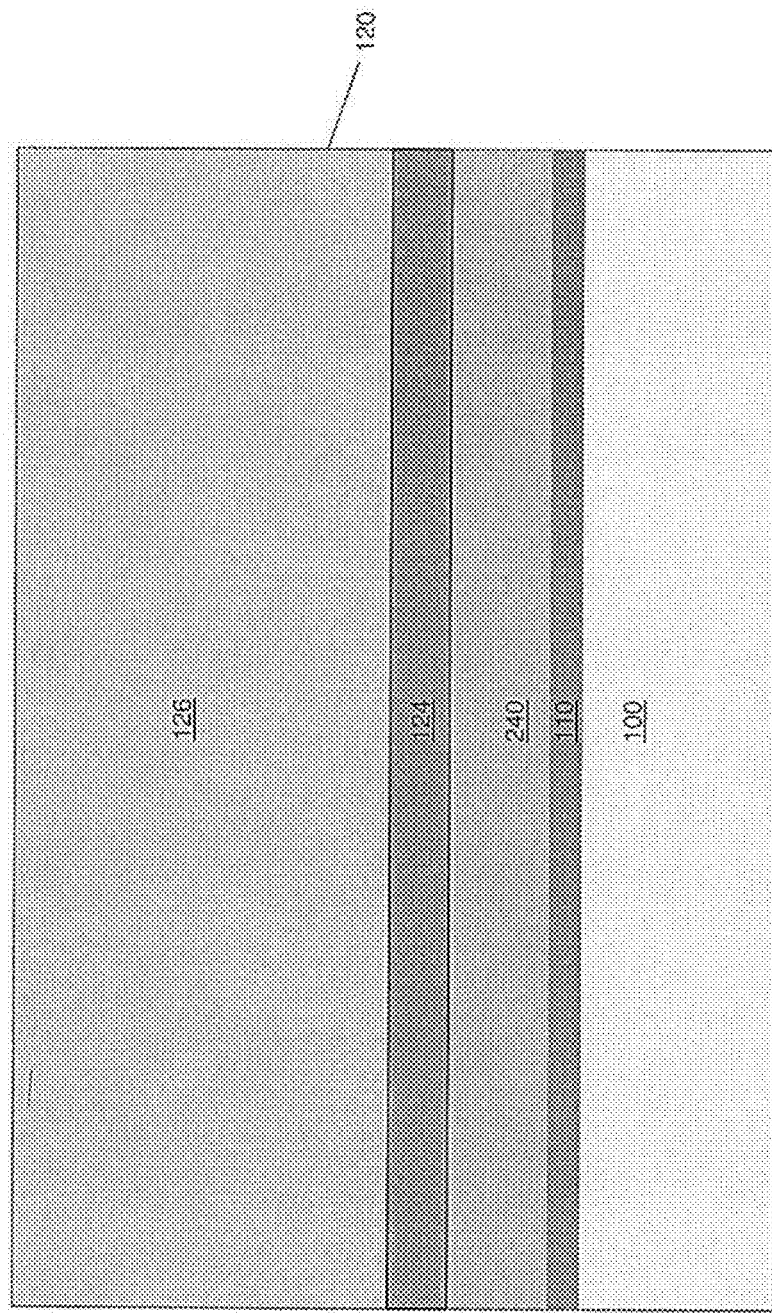
FIGS. 8A to 8D illustrate cross-sectional views of an embodiment of a method of manufacturing the diode shown in FIG. 7.

FIGS. 8A to 8D illustrate an embodiment of a method of manufacturing the diode shown in FIG. 7. FIG. 8A shows the structure after a nucleation region 110 is formed on a semiconductor substrate 100, a sequence 240 of GaN and AlGaN is formed on the nucleation region 110, and a buffer region 120 is formed on the sequence 240 of GaN and AlGaN. The buffer region 120 has a more highly doped section 124 adjacent the sequence 240 of GaN and AlGaN and a less highly doped section 126 spaced apart from the sequence 240 of GaN and AlGaN by the more highly doped section 124 as previously described herein. The III-V semiconductor regions 110, 240, 120 of the diode can be formed using any suitable conventional processing such as epitaxy.

Figure 8B:
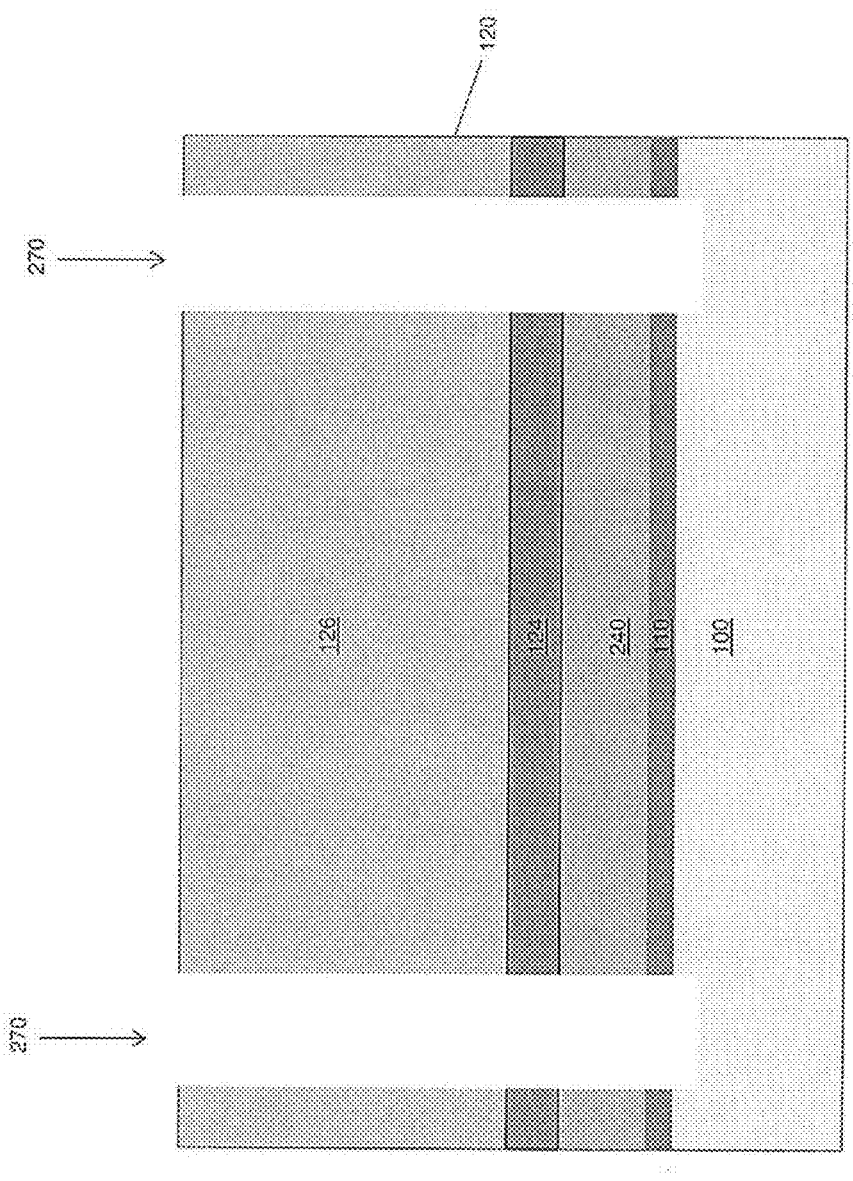
Figure 8C:
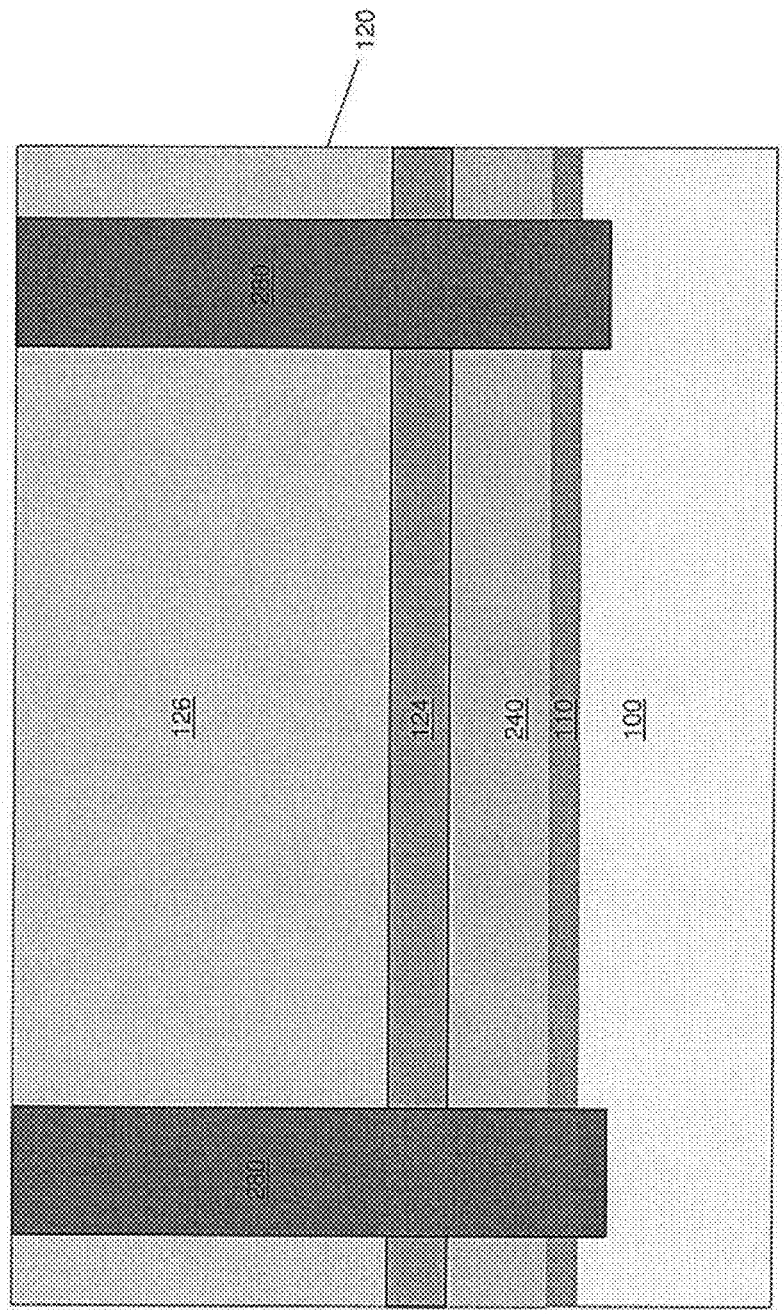

FIG. 8B shows the structure after openings 270 are etched through the III-V semiconductor regions 110, 240, 120 to the substrate 100. Any conventional etching process can be used to form the openings 270. At this point in the method, a portion of the substrate 100 is exposed through each opening 270. The openings 270 are then filled with a conductive material 280 such as tungsten or doped polysilicon as shown in FIG. 8C. Other conductive materials may be used instead or in addition to tungsten and/or doped polysilicon.

Figure 8D:
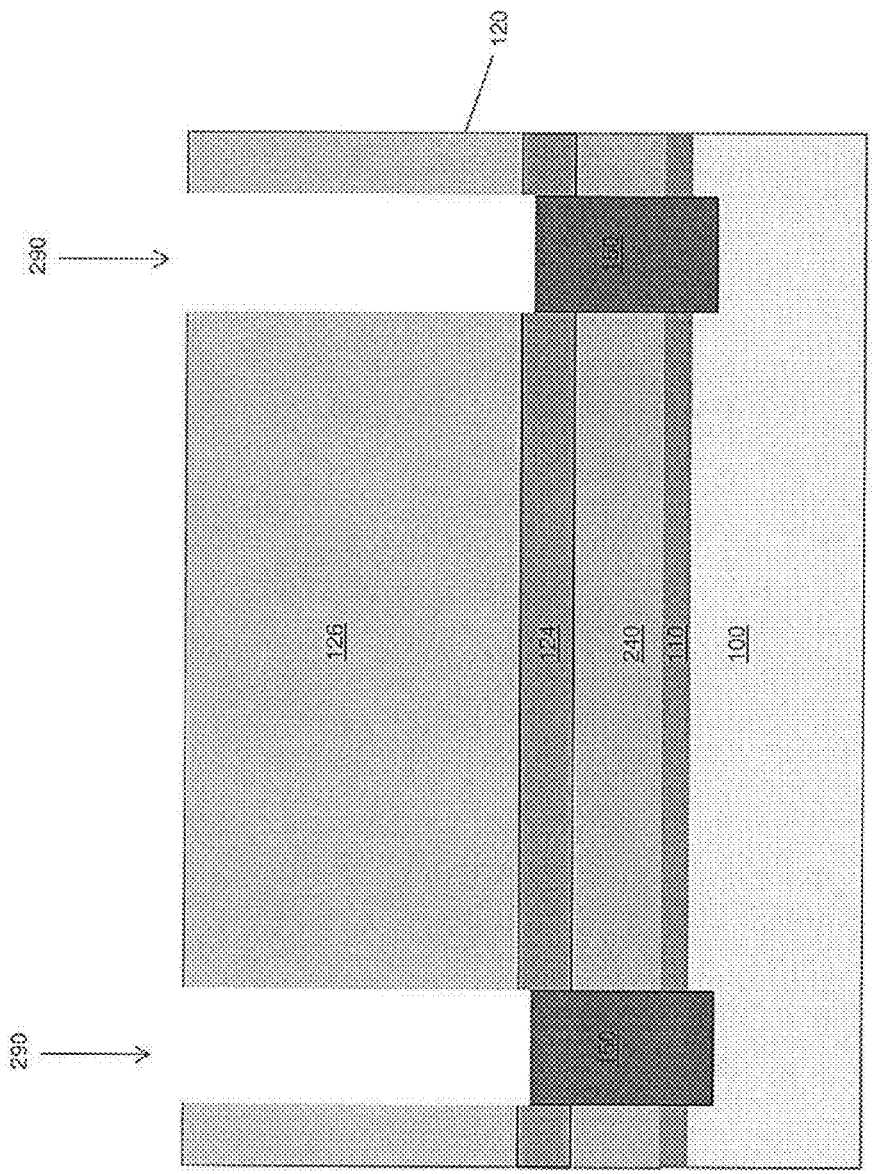

The conductive material 280 is recessed to form the corresponding buried contact 150 as shown in FIG. 8D. Any suitable conventional process for removing the excess conductive material 280 can be used. The conductive material 280 is recessed to below the junction formed between the more highly doped section 124 of the buffer region 120 and the less highly doped section 126 of the buffer region 120, leaving residual openings 290 in the upper part of the buffer region 120 as shown in FIG. 8D. The residual openings 290 is filled with a dielectric material 180 such as SiO2, and the anode and cathode terminals 160, 170 of the diode are formed yielding the diode shown in FIG. 7. As briefly described previously herein, a transistor can also be manufactured which has buried contacts.

Figure 9:
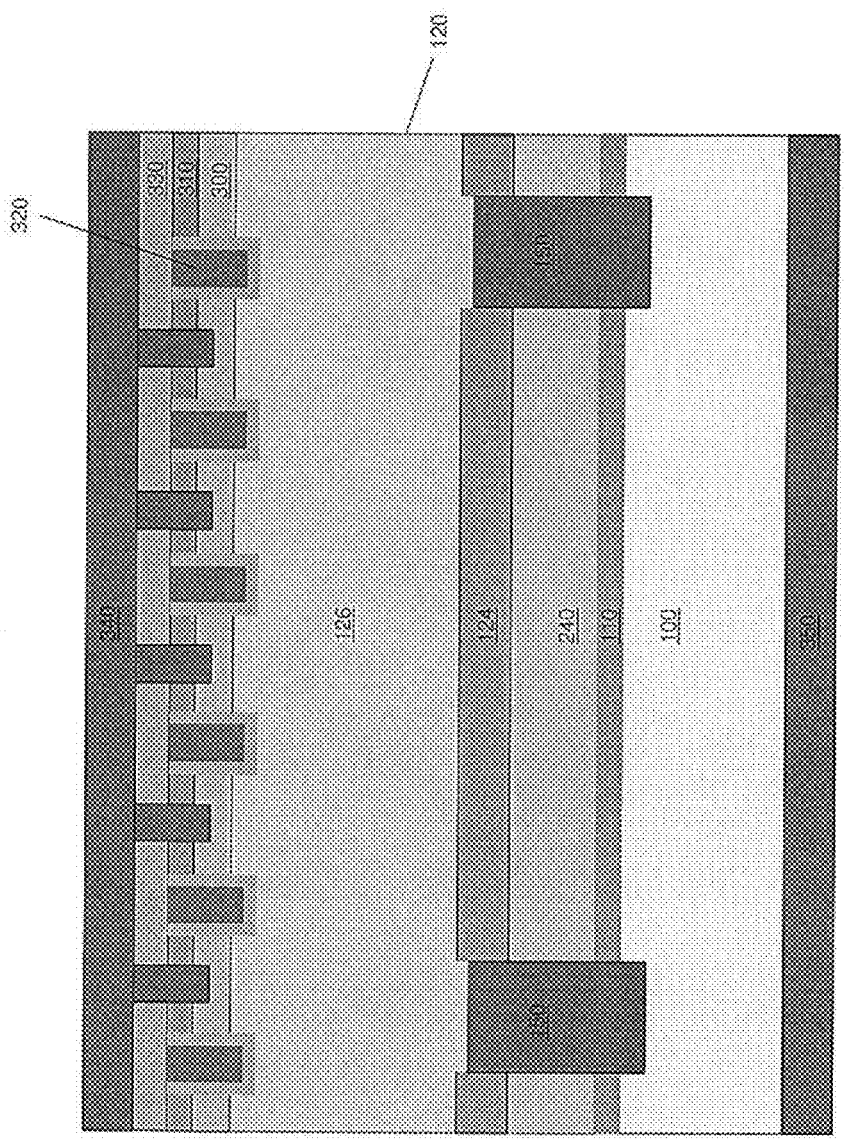
FIG. 9 illustrates a cross-sectional view of an embodiment of a III-V semiconductor transistor having a buried contact.

FIG. 9 illustrates an embodiment of a transistor device with buried contacts 150. The transistor device includes a substrate 100, a nucleation region 110 on the substrate 100, a sequence 240 of GaN and AlGaN on the nucleation region 110 and a buffer region 120 on the sequence 240 of GaN and AlGaN. The buffer region 120 has a more highly doped section 124 adjacent the sequence 240 of GaN and AlGaN and a less highly doped section 126 spaced apart from the sequence 240 of GaN and AlGaN by the more highly doped section 124. The III-V semiconductor regions 110, 240, 120 of the transistor device are similar to those of the diode shown in FIGS. 5 and 7. Also similar to the diode embodiments, the transistor includes one or more buried contacts 150 which electrically connect the more highly doped section 124 of the buffer region 120 to the substrate 100. Each buried contact 150 extends from the substrate 100 to the buffer region 120 through the nucleation region 110 and the sequence 240 of GaN and AlGaN. Adjacent ones of the buried contacts 150 are laterally spaced apart from one another by the more highly doped section 124 of the buffer region 120 and the sequence 240 of GaN and AlGaN. The more highly doped section 124 of the buffer region 120 provides a horizontal path for current to flow from the less highly doped section 124 of the buffer region 120 to the substrate 100 via the buried contacts 150.

The transistor further includes a III-V semiconductor body region 300 of the opposite doping type as the buffer region 120 which is disposed on the less highly doped section 126 of the buffer region 120. For example, the less highly doped section 126 of the buffer region 120 may be n– GaN and the body region 300 may be p GaN. A III-V semiconductor source region 310 of the same doping type as the buffer region 120 is disposed on the body region 300. Continuing with the example given above, the source region 310 could be n+ GaN. Any conventional processing such as epitaxy can be employed to form the body and source regions 300, 310. Gate electrodes 320 e.g. made of doped polysilicon or tungsten extend through the source and body regions 310, 300 and are isolated from the surrounding III-V semiconductor material by a gate dielectric 330 such as SiO2. A metallized top surface 340 of the transistor device provides a source terminal for the device, and extends into and in contact with the source and body regions 310, 300 which are at the same potential according to this embodiment. The backside of the transistor device also has a metallized surface 350, which forms the drain terminal of the device. The gate terminal is out of view in FIG. 9. The buried contacts 150 included in the transistor device can be formed in accordance with the method illustrated in FIGS. 6A to 6E according to an embodiment.

Figure 10:
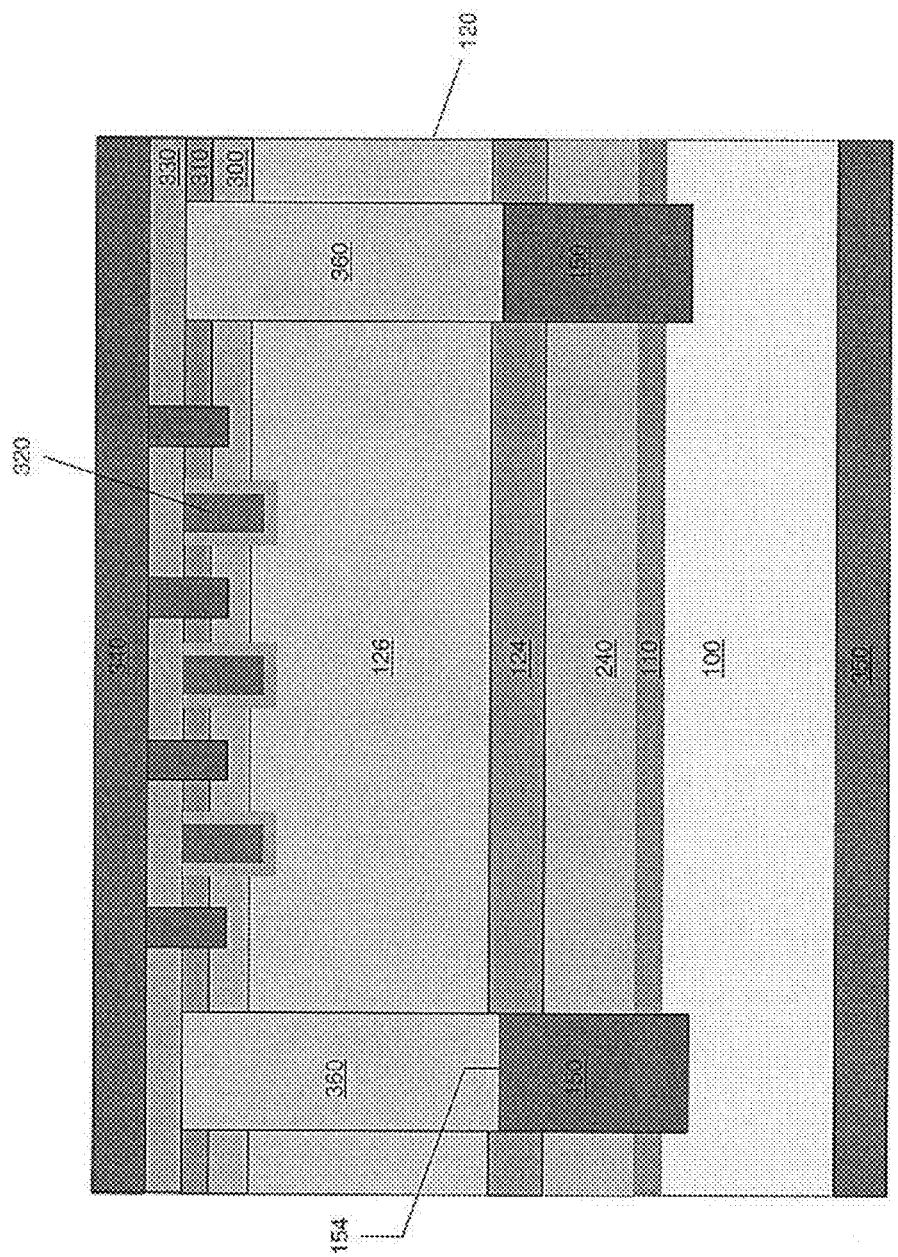
FIG. 10 illustrates a cross-sectional view of another embodiment of a III-V semiconductor transistor having a buried contact.

FIG. 10 illustrates another embodiment of a transistor device having buried contacts 150. The transistor device shown in FIG. 10 is similar to the one shown in FIG. 9, however the buried contacts 150 are formed in accordance with the method illustrated in FIGS. 8A to 8D according to this embodiment. As such, a dielectric material 360 extends from the side 154 of the buried contacts 150 facing away from the substrate 100 toward the top (source) metallization 340. The dielectric material 360 provides isolation as previously described herein.

The transistor devices described herein can exclude the sequence 240 of GaN and AlGaN as previously explained herein with regard to the diode embodiments. Also, the doping types identified in the examples given above can be reversed. The source, gate and drain contacts of the transistor can be formed on one side of the device instead of two sides. This applies to the diode embodiments as well. The term 'horizontal' as used herein refers to a plane extending generally perpendicular to the lateral sides of the semiconductor device, and the term 'vertical' refers to a plane extending generally perpendicular to the top and bottom sides of the semiconductor device, where the lateral sides extend between the top and bottom sides.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate;
   a first region of III-V semiconductor material on the semiconductor substrate;
   a second region of III-V semiconductor material on the first region with the second region spaced apart from the semiconductor substrate by the first region, the second region being of a different composition than the first region;
   a buried contact extending from the semiconductor substrate to the second region through the first region, the buried contact electrically connecting the second region to the semiconductor substrate, wherein the buried contact has a first side contacting the semiconductor substrate and a second opposing side contacting the second region; and
   a dielectric material extending from the second side of the buried contact toward a side of the second region facing away from the first region.

2. The semiconductor device of claim 1, wherein the first region is a nucleation layer and the second region comprises GaN.

3. The semiconductor device of claim 1, wherein the first region comprises AlN, the second region comprises $Al_xGa_{1-x}N$ and $0<=x<1$.

4. The semiconductor device of claim 1, wherein the semiconductor device is a diode further comprising:
   a first conductive layer at a side of the second region facing away from the first region; and
   a second conductive layer at a side of the semiconductor substrate facing away from the first region.

5. The semiconductor device of claim 4, wherein the diode is operable to withstand voltages in the range of 300V to 1200V.

6. The semiconductor device of claim 1, wherein the semiconductor device is a transistor further comprising:
   source and gate connections at a side of the second region facing away from the first region; and
   a drain connection at a side of the semiconductor substrate facing away from the first region.

7. The semiconductor device of claim 1, wherein the second region comprises a more highly doped section adjacent the first region and a less highly doped section spaced apart from the first region by the more highly doped section, and wherein the buried contact electrically connects the more highly doped section to the semiconductor substrate.

8. The semiconductor device of claim 7, wherein the more highly doped section extends along the first region from the buried contact to an additional buried contact extending from the semiconductor substrate to the second region through the first region, the buried contacts being laterally spaced apart from one another by the more highly doped section.

9. The semiconductor device of claim 1, wherein the buried contact comprises at least one of tungsten and doped polysilicon.

10. The semiconductor device of claim 1, further comprising a third region of III-V semiconductor material on the second region, the third region having a band gap greater than a band gap of the second region and causing a 2-D electron gas (2DEG) in the second region.

11. The semiconductor device of claim 10, further comprising a fourth region of III-V semiconductor material on the third region so that the third region is interposed between the second region and the fourth region.

12. The semiconductor device of claim 11, further comprising:
   a recess formed through the third and fourth regions; and
   an electrode disposed in the recess and in contact with the second region, and wherein the 2DEG terminates under the electrode.

13. The semiconductor device of claim 1, further comprising a third region of III-V semiconductor material interposed between the first and second regions, and wherein the buried contact extends from the semiconductor substrate to the second region through the first and third regions, the third region comprises a sequence of $Al_xGa_{1-x}N$ layers with different Al content and $0<=x<=1$.

14. A method of manufacturing a semiconductor device, comprising:
   forming a first region of III-V semiconductor material on a semiconductor substrate;
   forming a second region of III-V semiconductor material on the first region so that the second region is spaced apart from the semiconductor substrate by the first region, the second region being of a different composition than the first region;
   forming a buried contact extending from the semiconductor substrate to the second region through the first region, the buried contact electrically connecting the second region to the semiconductor substrate, wherein the buried contact has a first side contacting the semiconductor substrate and a second opposing side contacting the second region; and
   forming a dielectric material extending from the second side of the buried contact toward a side of the second region facing away from the first region.

15. The method of claim 14, wherein the semiconductor device is a diode and the method further comprises:
   forming a first conductive layer at a side of the second region facing away from the first region; and
   forming a second conductive layer at a side of the semiconductor substrate facing away from the first region.

16. The method of claim 14, wherein the semiconductor device is a transistor and the method further comprises:
   forming source and gate connections at a side of the second region facing away from the first region; and
   forming a drain connection at a side of the semiconductor substrate facing away from the first region.

17. The method of claim 14, wherein forming the first and second regions and the buried contact comprises:
   epitaxially growing the first region on the semiconductor substrate;
   epitaxially growing a more highly doped section of the second region on the first region;
   etching an opening through the more highly doped section of the second region and through the first region to the substrate;
   filling the opening with a conductive material to form the buried contact; and
   epitaxially growing a less highly doped section of the second region on the more highly doped section after the buried contact is formed, including a lateral overgrowth of the less highly doped section over the buried contact.

18. The method of claim 14, wherein forming the first and second regions and the buried contact comprises:
   epitaxially growing the first region on the semiconductor substrate;
   epitaxially growing the second region on the first region, the second region including a more highly doped section towards the first region and a less highly doped section on the more highly doped section;
   etching an opening through the first and second regions to the substrate;
   filling the opening with a conductive material;
   recessing the conductive material below a junction between the less highly doped section of the second region and the more highly doped section to form the buried contact and a residual opening in the second region above the buried contact; and
   filling the residual opening with the dielectric material.

19. The method of claim 14, wherein forming the second region comprises forming a more highly doped section contacting the first region and a less highly doped section above the more highly doped section, and wherein the buried contact electrically connects the more highly doped section to the semiconductor substrate.

20. The method of claim 19, further comprising forming an additional buried contact extending from the semiconductor substrate to the second region through the first region, the more highly doped section of the second region extending along the first region from the buried contact to the additional buried contact so that the buried contacts are laterally spaced apart from one another by the more highly doped section.

21. The method of claim 14, further comprising forming a third region of III-V semiconductor material on the second region, the third region having a band gap greater than the band gap of the second region and causing a 2-D electron gas (2DEG) in the second region.

22. The method of claim 21, further comprising forming a fourth region of III-V semiconductor material on the third region so that the third region is interposed between the second region and the fourth region.

23. The method of claim 22, further comprising:
   forming a recess through the third and fourth regions; and
   forming an electrode in the recess and in contact with the second region, and wherein the 2DEG terminates under the electrode.

24. The method of claim 14, further comprising forming a third region of III-V semiconductor material interposed between the first and second regions, and wherein the buried contact extends from the semiconductor substrate to the second region through the first and third regions, the third region comprises a sequence of $Al_xGa_{1-x}N$ layers with different Al content and $0<=x<=1$.

* * * * *